US012568293B1

(12) United States Patent
Ivgi

(10) Patent No.: US 12,568,293 B1
(45) Date of Patent: Mar. 3, 2026

(54) STABLE 3D OPTICAL SENSING DEVICE

(71) Applicant: INUITIVE LTD., Ra'anana (IL)

(72) Inventor: Mishel Ivgi, Yehud-Monoson (IL)

(73) Assignee: INUITIVE LTD., Ra' anana (IL)

( * ) Notice: Subject to any disclaimer, the term of this patent is extended or adjusted under 35 U.S.C. 154(b) by 0 days.

(21) Appl. No.: 18/817,729

(22) Filed: Aug. 28, 2024

(51) Int. Cl.
| | |
|---|---|
| *H04N 23/52* | (2023.01) |
| *H04N 13/239* | (2018.01) |
| *H05K 7/20* | (2006.01) |
| *H04N 13/00* | (2018.01) |

(52) U.S. Cl.
CPC ........... *H04N 23/52* (2023.01); *H04N 13/239* (2018.05); *H05K 7/2039* (2013.01); *H04N 2013/0081* (2013.01); *H04N 2213/001* (2013.01)

(58) Field of Classification Search
CPC ................ H04N 23/52; H04N 13/239; H04N 2013/0081; H04N 2213/001; H05K 7/2039
See application file for complete search history.

(56) References Cited

U.S. PATENT DOCUMENTS

| | | | | |
|---|---|---|---|---|
| 7,729,720 | B2 * | 6/2010 | Suh ..................... | H04M 1/0218 |
| | | | | 455/90.3 |
| 9,661,745 | B1 * | 5/2017 | Yazzie ................... | H04N 23/51 |
| 10,074,183 | B1 * | 9/2018 | Watson ................. | B64U 30/10 |
| 11,252,313 | B1 * | 2/2022 | Niu ........................ | G03B 17/14 |
| 12,335,422 | B2 * | 6/2025 | Iranmanesh .......... | G06F 3/0488 |
| 12,335,591 | B2 * | 6/2025 | Alaimo .................. | H04N 23/51 |
| 2002/0154217 | A1 * | 10/2002 | Ikeda ..................... | G08G 1/167 |
| | | | | 348/148 |
| 2010/0194884 | A1 * | 8/2010 | Plaster .................. | B60R 25/305 |
| | | | | 348/148 |
| 2016/0227078 | A1 * | 8/2016 | Oh .......................... | G03B 17/55 |
| 2016/0381260 | A1 * | 12/2016 | Narayanswamy ..... | H04N 23/57 |
| | | | | 348/360 |
| 2017/0217382 | A1 * | 8/2017 | Gunes ..................... | B60R 11/04 |
| 2018/0167540 | A1 * | 6/2018 | Liu ....................... | H04M 1/0277 |
| 2021/0006691 | A1 * | 1/2021 | García Abad ......... | H04N 23/55 |
| 2021/0092261 | A1 * | 3/2021 | Miller ................... | H04N 23/52 |

* cited by examiner

*Primary Examiner* — Peter D Le
(74) *Attorney, Agent, or Firm* — FisherBroyles, LLP; Roger L. Browdy; Ronni S. Jillions

(57) ABSTRACT

An electro-optical module (EOM) included within an enclosure is provided. The EOM comprises at least two camera modules, and configured to determine depth of a target by using a block matching algorithm operative to match pixels derived from an image captured by one of the camera modules with pixels derived from an image captured by another of the two camera modules. The EOM is characterized in that it comprises: a first isolating material located between the EOM and its enclosure, and configured to prevent structural forces from being developed due to deformation of the EOM enclosure; a main processor baseboard PCB to which each of the camera modules is connected; and one or more flat cables connecting the EOM enclosure with the main processor baseboard PCB, wherein the one or more flat cables are placed in an "s" shape within the EOM enclosure.

7 Claims, 3 Drawing Sheets

*100*

*120*

*110'*

*110"*

*210*

*230*     *220'*     *220"*

STABLE 3D OPTICAL SENSING DEVICE

TECHNICAL FIELD

The present disclosure generally relates to optical devices, and more particularly, to 3D optical sensing devices.

BACKGROUND

Stereo 3D sensing/scanning optical modules typically rely on using triangulation mechanism in order to sense depth, where the results are obtained by processing the outcome of two practically identical image sensors. The algorithm implemented by this mechanism utilizes block matching, namely, matching pixels derived from the left image with pixels derived from the right image.

In many 3D sensing optical modules, block matching algorithms are run under real time conditions and simultaneously match few pixel lines of the left and right sensors, to determine the depth of an object. Once a module is calibrated, it is expected that it will maintain its structural stability and will not deform over time, temperature and other environmental changes, since mechanical changes might severely affect the module's performance to detect accurate distance (depth).

However, one of the main issues associated with operating such optical modules is the management of instabilities such as those occurring due to thermal expansion in integrated 3D sensing modules. Thermal expansion e.g., by heat generated by the module or heat generated outside the module, might lead to mechanical distortion which leads to tiny movements of the optical elements (image sensor and/or lens) when compared with the initial calibration setup.

3D sensing systems might be sensitive even to microscopic movements in the magnitude of ~0.1-2 pixels in the XY plane. These movements translate to very small angular movement through the lens as a typical pixel has a typical size of 1-3 μm. This means that the left and right sensors must maintain their relative positions in order to be able to match pixels derived from the left and right sensors.

Thermal expansion is a natural phenomenon where a material expands or contracts along with temperature changes. A material expands with temperature in a linear way in accordance with its coefficient of expansion.

In order to maintain structural stability, the camera modules are usually placed on a metal stiffener. The metal stiffener may be of help to keep the dimensional stability of the module over time, provided that the metal stiffener was thermally treated in order to remove stresses. Stress removal is a very important factor because the metal stiffener is exposed to very high stress when manufactured by a CNC machine or by a molding injection. If stress is not relieved, the material forming the metal stiffener can deform over time in a slow process. This in turn might lead to structural stability problems. This is a "long term" effect which might be the cause of deterioration in the device's performance over time, and its impact is usually unpredictable.

In addition, there are other "short term" effects which occur during normal operation. Most of these short-term effects are caused by thermal expansion forces. These thermal expansion forces might be extremely high.

In 3D sensing applications, the electrical components are typically placed on a PCB (Printed Circuit Board) and the depth processor, which also runs other algorithms, can generate a large amount of heat which leads in turn to thermal expansion of the PCB.

FIG. 1 shows a prior art example of a 3D optical sensing apparatus 100, which comprises two optical sensors (110' and 110") which are two camera modules and an external enclosure 120.

FIG. 2 demonstrates a prior art example of a typical Printed Circuit Board ("PCB") 200 on which a processor is mounted, which is configured to be placed together with a camera module structure (a.k.a. "EOM"—Electro Optical Module) by connecting the PCB 200 via mechanical holes 210 to the EOM enclosure (not shown in this Fig.). As may be seen, hot spots at the PCB (220' and 220"), generated due to the operation of two camera modules, lead to thermal expansion of PCB 200 towards different, usually unpredictable, directions. Certain possible such thermal expansion vectors are shown in this figure such as 230. Since PCB 200 is fastened to the EOM enclosure as explained above, a thermal expansion of PCB 200 would lead to deformation of the external enclosure as a result of the strong forces generated by the thermal expansion of PCB 200. The deformation of the enclosure, might deform the EOM stiffener which expands at its own different rate, a rate which is different than the PCB's and the enclosure's expansion rates, and consequently might lead to a small angular structural difference between the left and right image sensors. The same is true for structure light 3D sensors which rely on the accuracy of placement between the image sensor and a pattern projector. The mechanical holes 210 are used for traversing screws that are used to fasten the PCB to the enclosure of the EOM. When these screws are tightened, they become anchors, and the thermally expanding PCB pushes hard against these anchors in different directions. This in turn would lead to deformation of the mechanical structure and consequently degrade the performance of the electro optical module.

SUMMARY OF THE DISCLOSURE

The disclosure may be summarized by referring to the appended claims.

It is an object of the present disclosure to provide a 3D optical sensing apparatus, which is characterized in that the optical sensors comprised therein, retain their position relative to the apparatus' enclosure, thereby essentially preventing deterioration of the apparatus performance.

It is another object of the present invention to provide a 3D optical sensing apparatus, which is characterized in that various components comprised within the 3D optical sensing apparatus, to expand at its own respective expansion rate, without having an adverse effect upon the performance of the 3D optical sensing apparatus due to changes occurring in the relative position of the optical sensing devices.

It is another object of the present invention to provide a 3D optical sensing apparatus, which retains its structural position and consequently the performance of the 3D optical sensing apparatus along with time and while operating at different temperatures.

It is another object of the present disclosure to provide an electro-optical module comprising two camera modules where the position of the two camera modules relative to each other is maintained.

Other objects of the present invention will become apparent from the following description.

The present invention relates to an Electro-Optical Module (hereinafter: "EOM"), being a 3D sensing module which requires an accurate and fixed position of its optical elements. The term a "EOM" as used herein throughout the specification and claims is used to denote a module that comprises at least two optical elements. One option encompasses the use of two or more camera modules (referred to herein as Compact Camera Module, "CCM"). Another option encompasses the use of at least one camera module and at least one projector, where the latter option is referred to as a structured-light 3D scanner. In addition, the EOM comprises a metal stiffener onto which the optical components as well as other components and a PCB may be attached.

In accordance with a first embodiment of the present invention, there is provided an electro-optical module ("EOM") included within an enclosure and comprising at least two camera modules wherein that EOM is configured to determine depth of a target by using a block matching algorithm operative to match pixels derived from an image captured by one of the at least two camera modules with pixels derived from an image captured by another of the at least two camera modules, wherein the EOM is characterized in that it comprises a combination of:

a first isolating material located between the EOM and its enclosure, wherein the first isolating material is configured to prevent structural forces from being developed due to deformation of the EOM enclosure, a deformation which could have an adverse effect upon the structural stability of one or both of the two camera modules;

a main processor baseboard PCB to which each of the at least two camera modules (i.e., Compact Camera Modules) is connected;

one or more flat cables connecting the EOM enclosure with the main processor baseboard PCB, wherein the one or more flat cables are placed in an "s" shape withing the EOM enclosure.

In accordance with another embodiment of the present disclosure, the electro-optical module further comprises:

a metal stiffener onto which optical components are mounted; and a junction PCB configured to be attached to the EOM's metal stiffener and to be connected to each of the at least two camera modules mounted on the stiffener. Optionally, the junction PCB may be configured to carry electrical components such as Inertial Module ("IMU"), power supplies, connectors, Flash memory, and the like.

By yet another embodiment, the one or more flat cables are further configured to connect the EOM enclosure with the junction PCB.

According to another embodiment of the present invention, the EOM is further characterized in that stresses are removed from the first isolating material prior to its incorporation within the EOM enclosure.

By yet another embodiment of the present invention, the EOM further comprises one or more heat sinks configured to remove heat dissipated from operative heat generating components comprised within the EOM enclosure, to a surface external to the EOM enclosure.

In accordance with still another embodiment, in case the main processor baseboard PCB or junction PCB is connected to a rear side of the EOM, that connection is characterized by having a single connecting point configured to firmly affix the main processor baseboard PCB or junction PCB to the EOM's stiffener (e.g., a screw), a connection that is referred to herein as "hard connection", and by having one or more soft connecting points, each adapted to ensure that pressure applied onto the main processor baseboard PCB or junction PCB does not exceed a predefined pressure, being a too low pressure from having an adverse effect upon the EOM. The significance of this embodiment is in the fact that it enables heat dissipated from the baseboard PCB components, to be extracted in a way that enables overcoming the differences in the expansion rates between the first isolating material located between the EOM structure and the enclosure, i.e., the metal stiffener onto which the camera modules are mounted.

According to still another embodiment of the present invention, the junction PCB is configured to be electrically connected to a connector located at an outer surface of the EOM enclosure, by one or more flat cables arranged in an "s" shape.

BRIEF DESCRIPTION OF THE DRAWINGS

For a more complete understanding of the present invention, reference is now made to the following detailed description taken in conjunction with the accompanying drawing wherein.

DETAILED DESCRIPTION

In this disclosure, the term "comprising" is intended to have an open-ended meaning so that when a first element is stated as comprising a second element, the first element may also include one or more other elements that are not necessarily identified or described herein, or recited in the claims.

In the following description, for the purposes of explanation, numerous specific details are set forth in order to provide a better understanding of the present invention by way of examples. It should be apparent, however, that the present invention may be practiced without these specific details.

As discussed above, the present invention relates to a 3D sensing module, an EOM, which requires an accurate and fixed position of its optical elements relative to each other, a relative position that does not change over time.

In order to achieve that goal, the present invention provides a way to isolate the EOM from being subjected to external mechanical forces, which might be transferred from the EOM enclosure inwardly towards the EOM components, so that the position of the optical elements (e.g. the two CCMs) relative to each other remains constant over time and temperature changes.

Mechanical forces which might lead to deformation of the EOM structure are:

1. Thermal expansion of the EOM itself due to component mounted thereat;
2. Thermal expansion of different elements anchored to the EOM at more than one point;
3. Thermal expansion of the enclosure within which the EOM is comprised;

4. Mechanical deformations of the EOM enclosure due to the following:

a. External mechanical forces applied onto the EOM enclosure when the EOM is installed where it is requires to operate (the target application), for example—a robot.

b. Deformation of the EOM enclosure due to the PCB expansion which is firmly connected to that enclosure.

c. Deformation due to the flat cables used to connect the camera modules to the main processor baseboard PCB.

Figure 1:
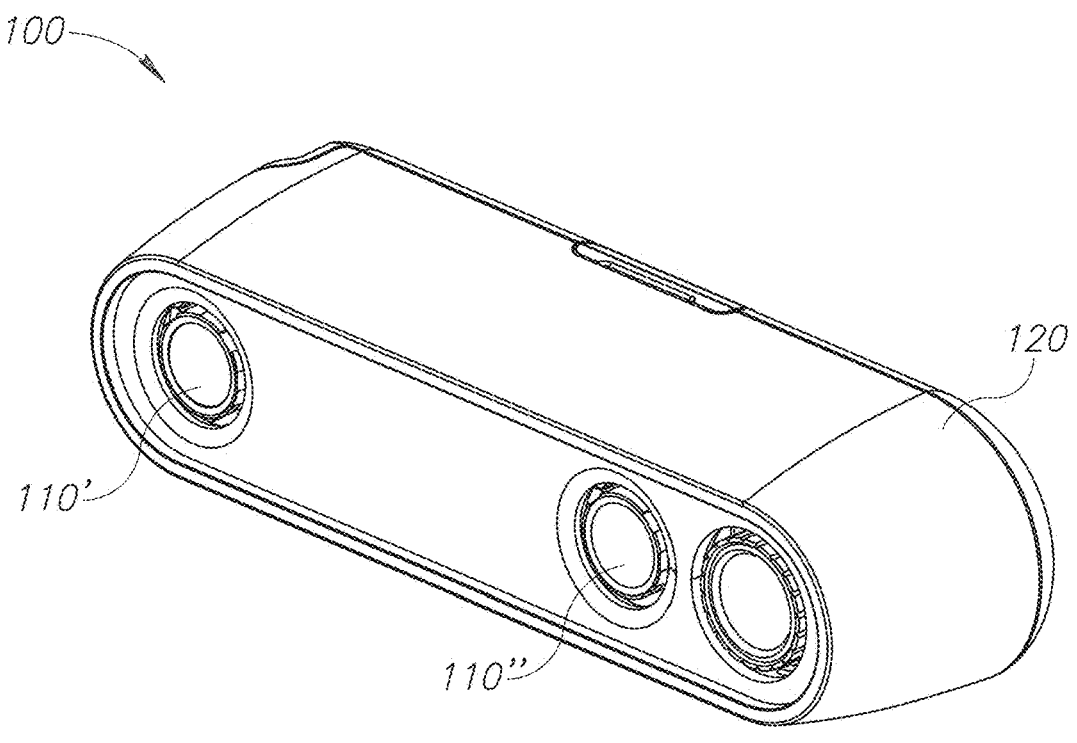
FIG. 1 shows a prior art example of a 3D optical sensing apparatus.
Figure 2:
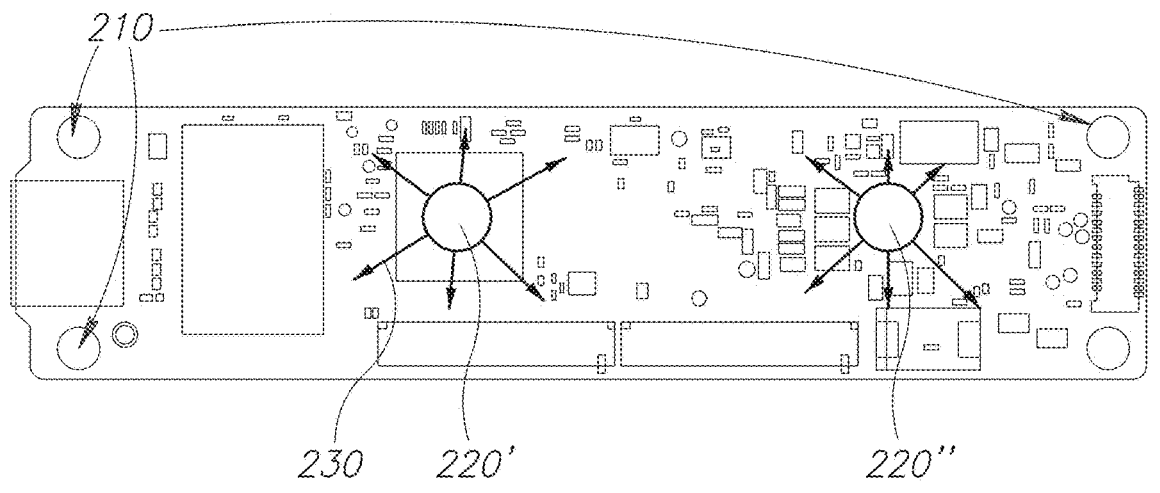
FIG. 2—illustrates a prior art typical PCB configured to be used in a 3D optical sensing apparatus.
Figure 3:
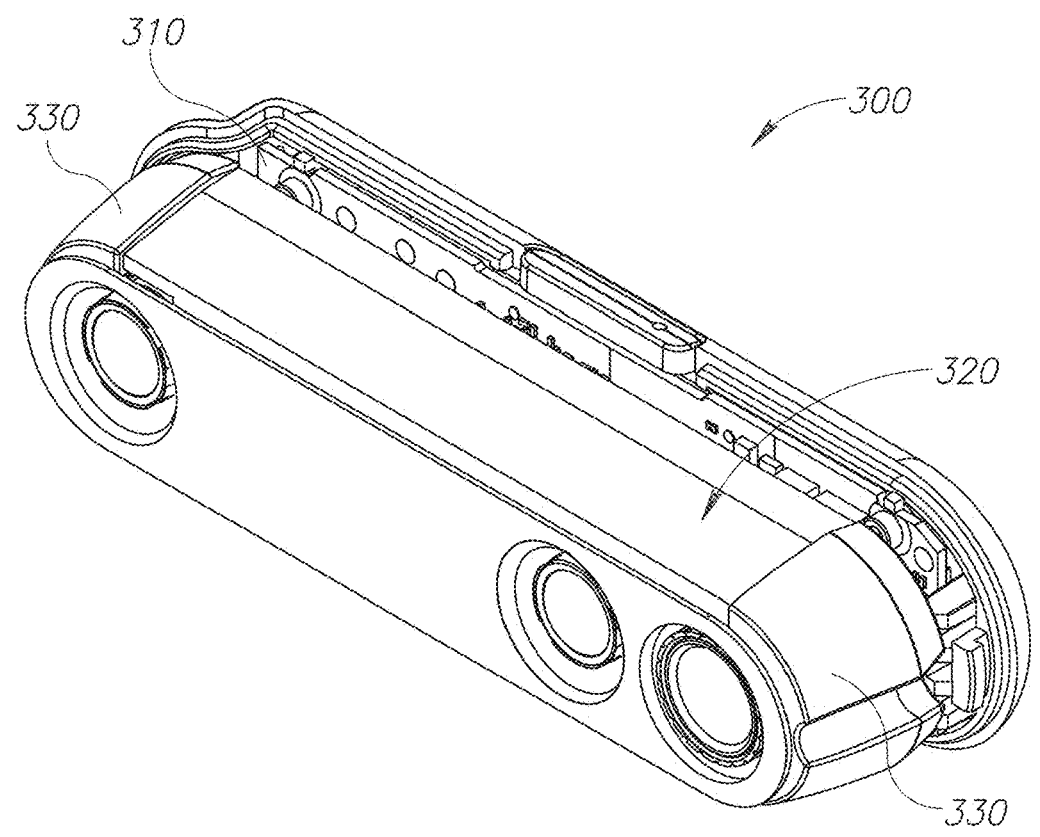
FIG. 3—demonstrates a 3D electro optical module construed in accordance with an embodiment of the present invention.

FIG. 3 demonstrates a 3D electro optical module 300 construed in accordance with an embodiment of the present invention. As depicted in this Fig., EOM 300 comprises PCB 310, EOM stiffener 320 and a second isolation material 330, which is a soft isolating material, such as for example, a molded silicon having Shore 30 hardness.

Figure 4:
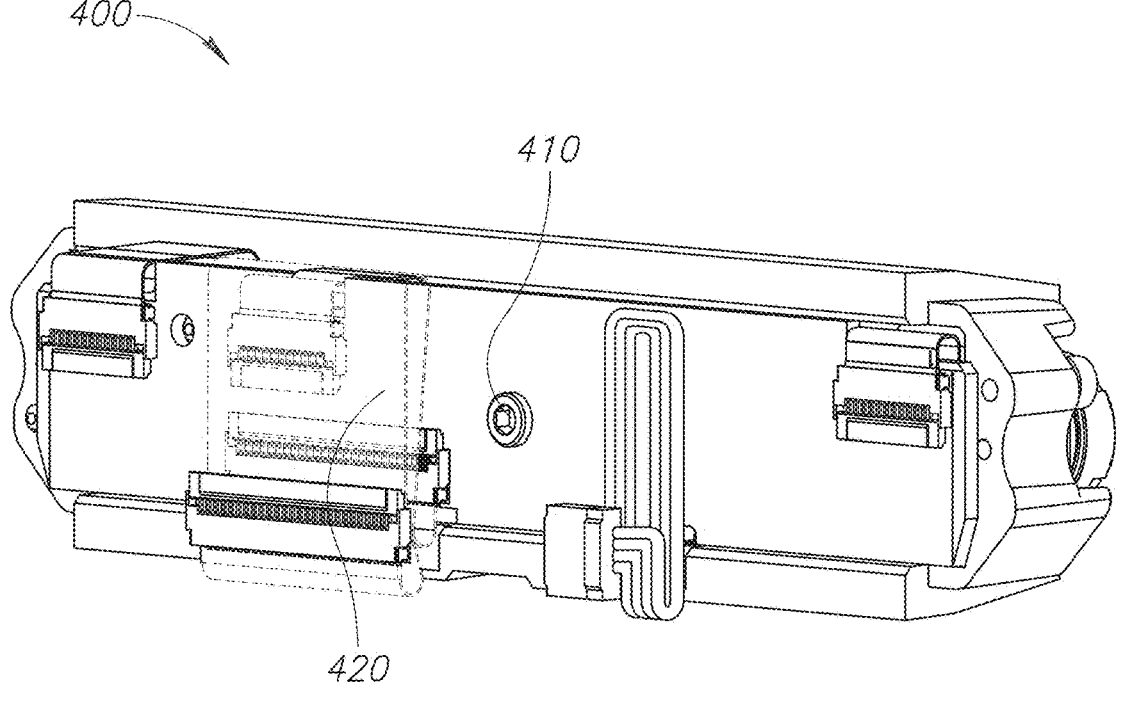
FIG. 4—illustrates a rear side of an exemplified junction PCB.

FIG. 4 illustrates a rear side of an exemplified junction PCB 400, adapted to be used in conjunction with an EOM. As can be seen from this view, there is a single connecting point 410 for firmly connecting the junction PCB 400 to the EOM's stiffener (not shown in this FIG.) by a single screw. Also, as may be seen in this FIG., a flexible loose flat cable 420 connects PCB 400 to the EOM enclosure. When the 3D optical sensing apparatus within which the EOM is installed, is assembled flat cable 420 is placed in an "s" shape therein.

Preferably, when a PCB junction is implemented in conjunction with the EOM, type S flexible cables are used to connect the junction PCB with the camera modules and another flexible cable is used to connect between the junction PCB and the main PCB.

If no junction PCB is used, the camera modules are preferably connected directly to the main PCB by using any applicable S shape flat flex cable (FPC).

Figures 5, 6:
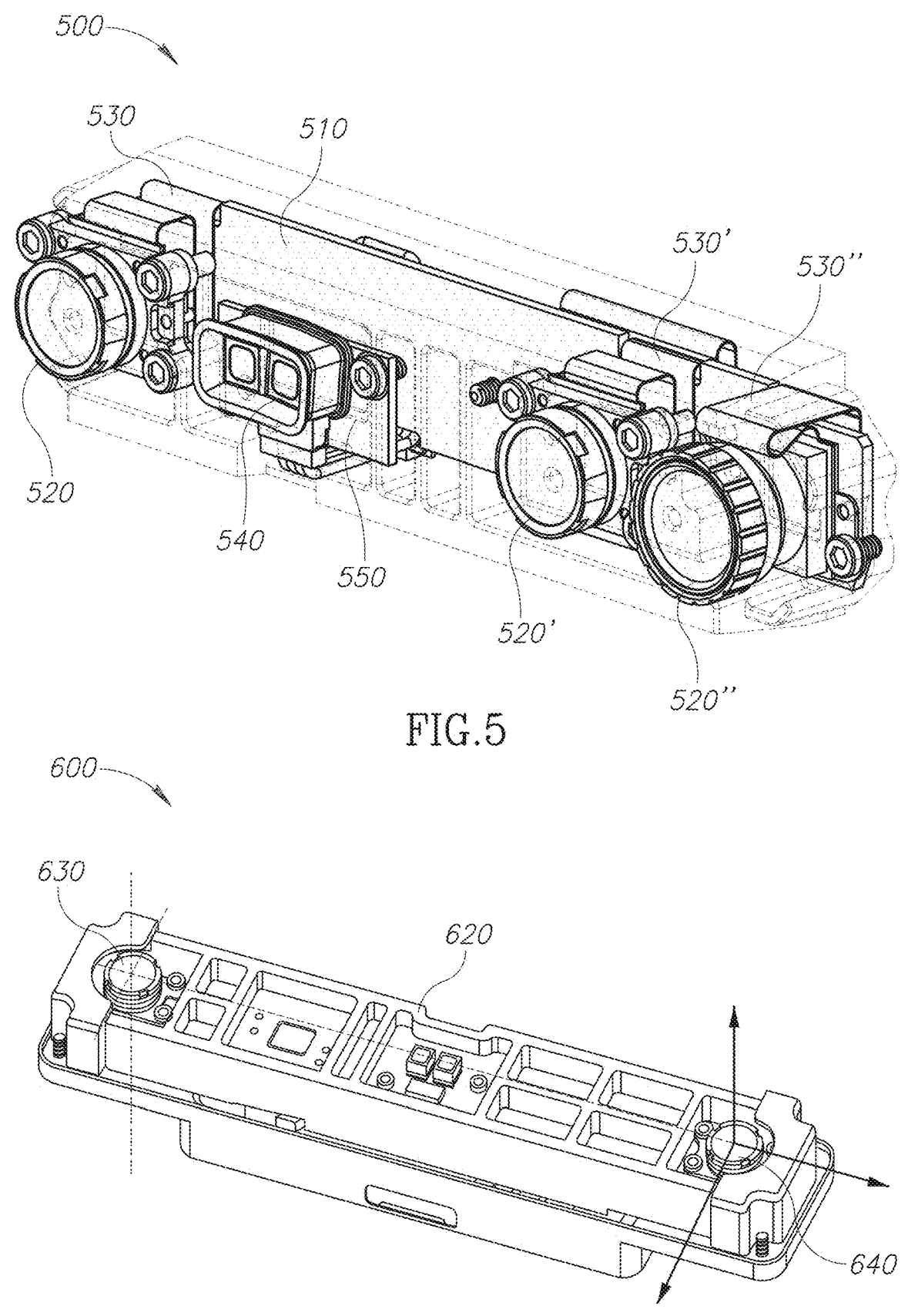
FIG. 5—illustrates another example of an EOM that comprises both camera modules and a projector.
FIG. 6—illustrates an example of a partial exploded view of a 3D sensing module (an EOM), construed in accordance with an embodiment of the present invention.

FIG. 5, demonstrates an example of a partial view of another example of an EOM 500. As may be seen in this example, the EOM comprises a PCB 510 to which a projector 540 and three camera modules, two of which are IR camera modules for depth processing and one RGB camera module, 520, 520' and 520", are attached using s-shaped flexible flat cables 530, 530' and 530", Projector 540 is also attached to PCB 510 using a flexible cable 550.

FIG. 6 illustrates an example of a partial exploded view of a 3D sensing module (an EOM), construed in accordance with an embodiment of the present invention.

In this Fig., electro optical module (EOM) 600 is exemplified. This exemplified module has a casing (enclosure) 610 which is partly shown in this Fig., and module 600 further includes an optical bench (a stiffener) 620 onto which two camera modules are mounted, a left CCM 630 and a right CCM 640, mounted at their predefined exact locations. The two camera modules 630 and 640 are each connected to a PCB (not shown in this Fig.).

As mentioned above, EOM enclosure 610 might be subjected to deformations due to expansion of the junction PCB which is firmly connected to the EOM enclosure 610, and due to external mechanical forces applied onto the EOM enclosure after the EOM had been installed and has been operating. In order to mitigate both these deformations a soft isolation material 650 is implemented.

In the description and claims of the present application, each of the verbs, "comprise" "include" and "have", and conjugates thereof, are used to indicate that the object or objects of the verb are not necessarily a complete listing of members, components, elements or parts of the subject or subjects of the verb.

The present invention has been described using detailed descriptions of embodiments thereof that are provided by way of example and are not intended to limit the scope of the invention in any way. The described embodiments comprise different features, not all of which are required in all embodiments of the invention. Some embodiments of the present invention utilize only some of the features or possible combinations of the features. Variations of embodiments of the present invention that are described and embodiments of the present invention comprising different combinations of features noted in the described embodiments will occur to persons of the art. The scope of the invention is limited only by the following claims.

The invention claimed is:

1. An electro-optical module included within an enclosure comprising at least two camera modules, wherein said electro-optical module is configured to determine depth of a target by using a block matching algorithm operative to match pixels derived from an image captured by one of the at least two camera modules with pixels derived from an image captured by another of the at least two camera modules, wherein the electro-optical module comprises:

a first thermally isolating material located between the electro-optical module and its enclosure, wherein the first thermally isolating material is configured to isolate the electro-optical module from being subjected to external mechanical forces, transferred from the electro-optical module enclosure inwardly towards the electro-optical module components, to ensure that the at least two camera modules relative positions to each other, remain constant over time and temperature changes;

a main processor baseboard PCB to which each of the at least two camera modules is connected; and one or more flat cables connecting the electro-optical module enclosure with the main processor baseboard PCB, wherein the one or more flat cables are placed in an "s" shape within the electro-optical module enclosure.

2. The electro-optical module of claim 1, further comprising:

a metal stiffener onto which optical components are mounted; and a junction PCB configured to be attached to said metal stiffener and to be connected to each of the at least two camera modules mounted on the stiffener.

3. The electro-optical module of claim 2, wherein said one or more flat cables are further configured to connect the electro-optical module enclosure with the junction PCB.

4. The electro-optical module of claim 2, wherein in a case that the main processor baseboard PCB or junction PCB is connected to a rear side of the electro-optical module, that connection is characterized by having a single connecting point configured to firmly affix the main processor baseboard PCB or junction PCB to the electro-optical module's stiffener, and by having one or more soft connecting points, each adapted to ensure that pressure applied onto the main processor baseboard PCB or junction PCB does not exceed a predefined pressure, being a too low pressure from having an adverse effect upon the electro-optical module.

5. The electro-optical module of claim 2, wherein said junction PCB is configured to be electrically connected to a connector located at an outer surface of the electro-optical module enclosure, by one or more flat cables arranged in an "s" shape.

6. The electro-optical module of claim 1, wherein stresses are removed from said first isolating material prior to its incorporation within the electro-optical module enclosure.

7. The electro-optical module of claim 1, further comprising one or more heat sinks configured to remove heat dissipated from operative heat generating components comprised within said electro-optical module enclosure, to a surface external to the electro-optical module enclosure.

\* \* \* \* \*